United States Patent
Wang et al.

(10) Patent No.: US 10,581,029 B2
(45) Date of Patent: Mar. 3, 2020

(54) METHOD FOR MANUFACTURING ORGANIC ELECTROLUMINESCENCE DEVICE, AND ORGANIC ELECTROLUMINESCENCE DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jun Wang, Beijing (CN); Ce Zhao, Beijing (CN); Dongfang Wang, Beijing (CN); Bin Zhou, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Ahnui (CN)

( * ) Notice: Subject to any disclaimer, the term of this patent is extended or adjusted under 35 U.S.C. 154(b) by 83 days.

(21) Appl. No.: 15/802,431

(22) Filed: Nov. 2, 2017

(65) Prior Publication Data
US 2018/0315961 A1   Nov. 1, 2018

(30) Foreign Application Priority Data
Apr. 28, 2017   (CN) .......................... 2017 1 0293723

(51) Int. Cl.
*H01L 51/52*   (2006.01)
*H01L 51/56*   (2006.01)
(Continued)

(52) U.S. Cl.
CPC .......... *H01L 51/56* (2013.01); *H01L 27/3237* (2013.01); *H01L 51/5072* (2013.01);
(Continued)

(58) Field of Classification Search
CPC ............. H01L 51/5225; H01L 51/5262; H01L 51/5209
See application file for complete search history.

(56) References Cited

U.S. PATENT DOCUMENTS

| 6,670,772 | B1 | 12/2003 | Arnold et al. |
| 2009/0152533 | A1 | 6/2009 | Chan et al. |

(Continued)

FOREIGN PATENT DOCUMENTS

| CN | 1819727 A | 8/2006 |
| CN | 101946341 A | 1/2011 |
| CN | 103094488 A | 5/2013 |

OTHER PUBLICATIONS

South China University of Technology, "Research of Parallax Barrier 3D Display Technology Based on AMOLED," Yan Xiu.
(Continued)

*Primary Examiner* — Thomas L Dickey
(74) *Attorney, Agent, or Firm* — Kinney & Lange, P.A.

(57) ABSTRACT

The present disclosure provides a method for manufacturing an organic electroluminescence device, including steps of: adjusting a grating period of a periodic grating structure in such a manner that a wavelength of an emergent light beam caused by SP-coupling is within a predetermined range of a light-emission peak of the organic electroluminescence device; and forming the periodic grating structure in the organic electroluminescence device in accordance with the obtained grating period by adjustment.

10 Claims, 3 Drawing Sheets

(51) Int. Cl.
*H01L 27/32* (2006.01)
*H01L 51/50* (2006.01)

(52) U.S. Cl.
CPC ...... *H01L 51/5209* (2013.01); *H01L 51/5218* (2013.01); *H01L 51/5225* (2013.01); *H01L 51/5275* (2013.01)

(56) References Cited

U.S. PATENT DOCUMENTS

2014/0001450 A1* 1/2014 Shinotsuka ......... H01L 51/5225
257/40
2014/0203258 A1 7/2014 Guo et al.

OTHER PUBLICATIONS

First Chinese Office Action dated Apr. 4, 2018, for corresponding Chinese Application No. 201710293723.9.
Jilin University-China, "Enhanced Efficiency of the Top-Emitting Organic Light-Emitting Device with Corrugated Microstructure", Jun. 3, 2010, with English Abstract.
Second Chinese Office Action dated Nov. 9, 2018, received for corresponding Chinese Application No. 201710293723.9.

* cited by examiner

METHOD FOR MANUFACTURING ORGANIC ELECTROLUMINESCENCE DEVICE, AND ORGANIC ELECTROLUMINESCENCE DEVICE

CROSS-REFERENCE TO RELATED APPLICATION

The present application claims a priority of the Chinese patent application No. 201710293723.9 filed on Apr. 28, 2017, which is incorporated herein by reference in its entirety.

TECHNICAL FIELD

The present disclosure relates to, but is not limited to, the field of electronics technology, in particular to a method for manufacturing an organic electroluminescence device and the organic electroluminescence device.

BACKGROUND

A light-emission procedure of an organic electroluminescence device is just an energy transfer procedure, in which electric energy is converted into optical energy. During this conversion, the organic electroluminescence device may be deemed as an injection-type light-emitting diode (LED). In the case that a voltage is applied to two ends of the organic electroluminescence device, under the effect of an electric field generated due to the applied voltage, electrons may be injected from a cathode of the organic electroluminescence device to an electron transport layer and holes may be injected from an anode of the organic electroluminescence device into a hole transport layer. These two carriers enter a light-emitting layer and are combined into excitons which are capable of emitting light through radiative recombination.

Usually, metallic electrodes are widely used in an organic light-emitting diode (OLED) device, and surface plasmon (SP) is generated at a metallic surface. To be specific, the movement of the electrons in a lateral direction (a direction perpendicular to a metallic surface) at the metallic surface is obstructed by the surface, and concentrations of the electrons in proximity to the surface are distributed gradiently, so plasma oscillation is formed in such a manner as to be restricted to the metallic surface. This electron dilatational wave formed by the plasma oscillation on the metallic surface is defined as the SP. The SP is propagated in a direction along an interface between a metal and an organic material, and an electric field intensity is decreased exponentially in a direction perpendicular to the interface. The SP is capable of being coupled with the excitons so as to generate exciton annihilation, so photons generated by an electro-luminescence (EL) material cannot leave the device, and instead, they may be absorbed by the metal in the form of SP oscillation localization or lost in the form of heat. In this regard, the external quantum efficiency of the EL device may be remarkably reduced.

Due to the fraction of power coupled to SP and the excitons at the interface between the metal and the EL material, luminous efficiency of the EL device may be remarkably reduced. For the OLED device, especially a bottom-emission device, due to the coupling of the SP with the excitons, a considerable optical loss may occur.

SUMMARY

An object of the present disclosure is to provide a method for manufacturing an organic electroluminescence device, and the resultant organic electroluminescence device, so as to improve the luminous efficiency of the organic electroluminescence device.

In one aspect, the present disclosure provides in some embodiments a method for manufacturing an organic electroluminescence device, including steps of: adjusting a grating period of a periodic grating structure in such a manner that a wavelength of an emergent light beam caused by SP-coupling is within a predetermined range of a light-emission peak of the organic electroluminescence device; and forming the periodic grating structure in the organic electroluminescence device in accordance with the obtained grating period by adjustment.

In a possible embodiment of the present disclosure, the organic electroluminescence device is a bottom-emission device, and the step of forming the periodic grating structure in the organic electroluminescence device includes: forming the periodic grating structure with a metallic cathode in accordance with the grating period, so as to form a periodic metallic grating structure; or forming a cathode with a transparent conductive oxide, and forming the periodic metallic grating structure on a glass cover substrate above the transparent conductive oxide in a direction opposite to a light-emission direction in accordance with the grating period.

In a possible embodiment of the present disclosure, the organic electroluminescence device is a top-emission device, and the step of forming the period grating structure in the organic electroluminescence device includes: forming the periodic grating structure with a metallic anode in accordance with the grating period, so as to form a periodic metallic grating structure; or forming an anode with a transparent conductive oxide, and arranging the periodic metallic grating structure below the transparent conductive oxide in a direction opposite to a light-emission direction in accordance with the grating period.

In a possible embodiment of the present disclosure, the periodic metallic grating structure is separated from the transparent conductive oxide through a transparent insulation layer.

In a possible embodiment of the present disclosure, the grating period is in direct proportion to the wavelength of the emergent light beam from the organic electroluminescence device.

In a possible embodiment of the present disclosure, the step of forming the periodic grating structure in the organic electroluminescence device includes: from top to bottom, forming the periodic grating structure on a passivation layer PVX of a thin film transistor (TFT) substrate at a corresponding EL region through a dry-etching process or an exposing-and-developing process; depositing a metallic reflective layer onto the periodic grating structure through sputtering, so as to reproduce the periodic grating structure under the metallic reflective layer at the EL region; depositing an insulation layer onto the metallic reflective layer through plasma chemical vapor deposition (PCVD); depositing a transparent conductive oxide onto the insulation layer through sputtering so as to form an anode, and depositing an EL layer onto the transparent conductive oxide through evaporation; and forming a transparent metallic cathode onto the EL layer through thermal evaporation.

In a possible embodiment of the present disclosure, the predetermined range of the light-emission peak of the organic electroluminescence device is 500 nm~800 nm.

In a possible embodiment of the present disclosure, the grating period is adjusted using the following equation:

$$k_{light}(\lambda) = \frac{2\pi}{\lambda}\sin\theta = k_{sp}(\lambda) \pm \frac{2\pi}{\Lambda}m,$$

where $K_{light}$ represents a wave vector of the emergent light beam; $\lambda$ represents a wavelength of the emergent light beam; $\theta$ represents a measurement angle, $\Lambda$ represents the grating period, m represents a magnitude, Ksp represents a wave vector of the SP and is calculated using the following equation:

$$k_{sp}(\lambda) = \frac{2\pi}{\lambda}\sqrt{\frac{\varepsilon_1\varepsilon_2}{\varepsilon_1+\varepsilon_2}},$$

where $\varepsilon1$ and $\varepsilon2$ represent dielectric constants of a metal and a medium.

In another aspect, the present disclosure provides in some embodiments an organic electroluminescence device, including: a metallic cathode in the form of a periodic metallic grating structure; or a cathode made of a transparent conductive oxide and the periodic metallic grating structure arranged on a glass cover substrate above the transparent conductive oxide in a direction opposite to a light-emission direction; or a metallic anode in the form of the periodic metallic grating structure; or an anode made of a transparent conductive oxide and the periodic metallic grating structure arranged below the transparent conductive oxide in a direction opposite to a light-emission direction.

In a possible embodiment of the present disclosure, the periodic metallic grating structure is separated from the transparent conductive oxide through a transparent insulation layer.

In a possible embodiment of the present disclosure, the transparent insulation layer is a transparent insulation inorganic film.

In a possible embodiment of the present disclosure, a grating period of the periodic grating structure is in direct proportion to a wavelength of an emergent light beam from the organic electroluminescence device.

In a possible embodiment of the present disclosure, in the case that the organic electroluminescence device includes the metallic cathode in the form of the periodic metallic grating structure, or the cathode made of the transparent conductive oxide and the periodic metallic grating structure arranged on the glass cover substrate above the transparent conductive oxide in a direction opposite to a light-emission direction, the organic electroluminescence device is a bottom-emission device.

In a possible embodiment of the present disclosure, in the case that the organic electroluminescence device includes the metallic anode in the form of the periodic metallic grating structure; or the anode made of the transparent conductive oxide and the periodic metallic grating structure arranged below the transparent conductive oxide in a direction opposite to the light-emission direction, the organic electroluminescence device is a top-emission device.

In a possible embodiment of the present disclosure, the organic electroluminescence device is an OLED.

As compared with the related art, the manufacturing method in the embodiments of the present disclosure includes steps of: adjusting the grating period of the a periodic grating structure in such a manner that the wavelength of the emergent light beam generated by the coupling of the SP is within the predetermined range of the light-emission peak of the organic electroluminescence device; and forming the periodic grating structure in the organic electroluminescence device in accordance with the obtained grating period by adjustment. Through the periodic grating structure in the organic electroluminescence device, e.g., the OLED device, it is able to couple the optical wave with the SP, so as to regain, through the adjustment of surface plasmon polariton (SPP), the photon energy that has been lost at the interface of the metallic electrode and enhance an optical output of the organic electroluminescence device, e.g., the OLED device, thereby to improve the luminous efficiency of the organic electroluminescence device, e.g., the OLED device.

Further, for the top-emission device, in the case that the anode is made of the transparent conductive oxide and the periodic metallic grating structure is arranged below the transparent conductive oxide, the periodic metallic grating structure is separated from the transparent conductive oxide through the transparent insulation layer. In this way, it is able to, on one hand effectively improve hole injection capability through the anode made of the transparent conductive oxide, and on the other hand, facilitate the adjustment of the optical wave by adjusting a dielectric constant of the transparent insulation layer and prevent electrons in the metal from being diffused into the transparent electrode.

The other features and advantages of the present disclosure will be described hereinafter, and parts of them will become more apparent or will be understood through the implementation of the present disclosure. The objects and the other advantages of the present disclosure may be achieved through the description, the claims and structures specified in the drawings.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure. It should be appreciated that, the embodiments of the present disclosure and the features therein may be combined in any form in the case of no conflict.

Figure 1:
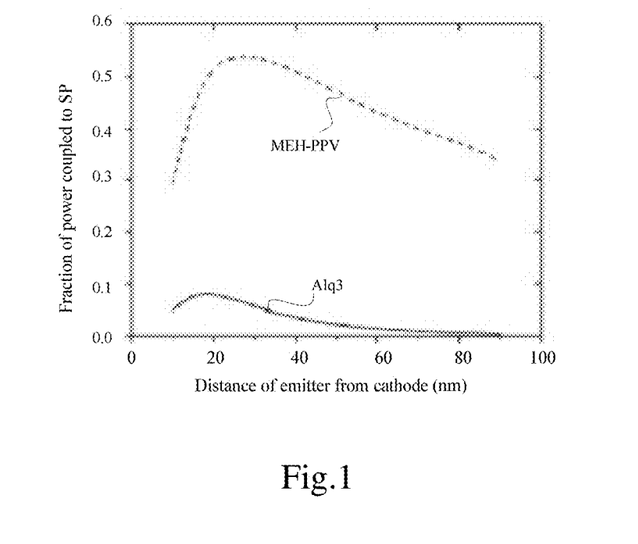
FIG. 1 is a curve diagram of a relationship between a fraction of power coupled to SP and a distance of an emitter from a cathode in a conventional organic electroluminescence device.

Due to a fraction of power coupled to SP at an interface between a metal and an EL material with excitons, the luminous efficiency of an EL device may be remarkably reduced. Especially for a small-molecule organic electroluminescence device, the energy loss caused by, e.g., Alq3, is up to 40%. Referring to FIG. 1, which is a curve diagram of relationships between a fraction of power coupled to SP and a distance of an emitter from a cathode in a polymer (e.g., MEH-PPV) organic electroluminescence device and a small-molecule (e.g., Alq3) organic electroluminescence device, in the case that the distance between the emitter and the cathode is smaller than 30 nm, the energy loss caused by the SP-coupling increases dramatically, and in the case that the distance between the emitter and the cathode is greater than 30 nm, the energy loss decreases. In other words, for the OLED device, especially a bottom-type OLED device, there is a considerable optical loss due to the coupling of the SP with excitons.

Figure 2:
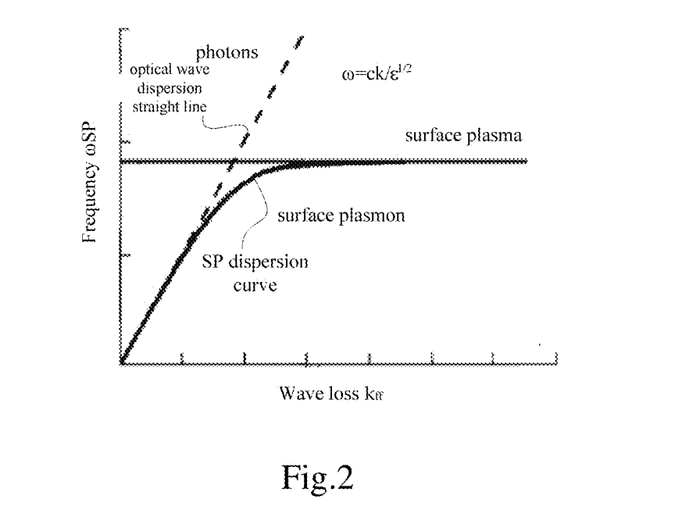
FIG. 2 is an analysis reference map of a method for manufacturing an organic electroluminescence device according to one embodiment of the present disclosure.

Through SPP, i.e., in the case that free electrons at a metallic surface oscillate under the irradiation with an optical wave having a resonant frequency identical to the free electrons, the photons coupled to the metallic surface may be released. Generally, an optical wave dispersion straight line is located on the left of a SP dispersion curve, as shown in FIG. 2. It is found that, in the case that the photons are to be coupled with the SP, there must be an intersection between the SP dispersion curve and the optical wave dispersion straight line. In order to ensure the internal SP to be coupled with the external optical wave, a position of the optical wave dispersion straight line relative to the SP dispersion curve may be changed, i.e., the optical wave dispersion straight line may be moved to the right or the SP dispersion curve may be moved to the left, so as to form an intersection therebetween, thereby to generate resonance. A radiant state of the SP would be formed (i.e., the SP would be converted into light) and the optical energy would be converted into the energy for the SP only in the case that the resonance occurs between the SP and the optical wave. In this way, it is able to couple the SP with the optical wave in the EL device, thereby to regain the energy that has been lost due to the coupling of the SP with the excitons, re-convert the energy into the optical energy, and release the optical energy.

On the basis of the above analysis, it is considered that, in the case that a periodic grating structure, e.g., a periodic Bragg diffraction grating structure, is introduced into the organic electroluminescence device, e.g., the OLED device, the SP may be coupled with the optical wave, so as to release the optical energy. This is because, after the grating structure has been introduced into the organic electroluminescence device at an appropriate position, the SP dispersion curve may be translated to the left. At this time, the optical wave dispersion straight line may intersect the SP dispersion curve, so the SP may be coupled with the optical wave so as to generate an emergent light beam. For example, the following coupling equation may be used:

$$k_{light}(\lambda) = \frac{2\pi}{\lambda}\sin\theta = k_{sp}(\lambda) \pm \frac{2\pi}{\Lambda}m \quad (1)$$

where $K_{light}$ represents a wave vector of an emergent light beam, $\lambda$ represents a wavelength, $\theta$ represents a measurement angle, $\Lambda$ represents a grating period, m represents a magnitude (usually, m is 1), and Ksp represents a wave vector of the SP. Ksp may be calculated using the following equation:

$$k_{sp}(\lambda) = \frac{2\pi}{\lambda}\sqrt{\frac{\varepsilon_1\varepsilon_2}{\varepsilon_1+\varepsilon_2}} \quad (2)$$

where $\varepsilon 1$ and $\varepsilon 2$ represent dielectric constants of a metal and a medium respectively. After equation (2) is substituted into equation (1), the following equation may be acquired:

$$\frac{2\pi}{\lambda}\sqrt{\frac{\varepsilon_1\varepsilon_2}{\varepsilon_1+\varepsilon_2}} = \pm\frac{2\pi}{\Lambda}. \quad (3)$$

Based on equation (3), the grating period $\Lambda$ is in direct proportion to the wavelength $\lambda$. In other words, through changing the grating period in such a manner that the wavelength of the emergent light beam caused by the SP-coupling is just in proximity to a light-emission peak of the organic electroluminescence device, e.g., the OLED device, it is able to enhance the optical output of the organic electroluminescence device, e.g., the OLED device.

Figure 3:
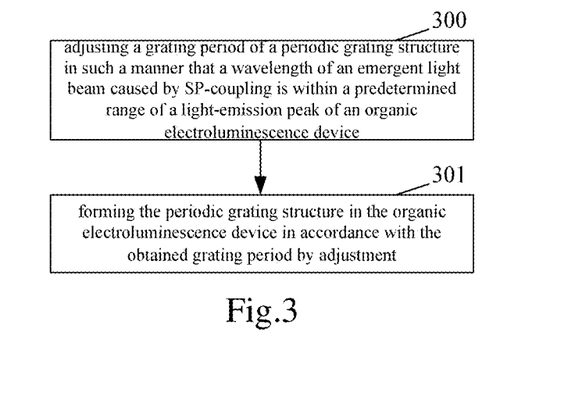
FIG. 3 is a flow chart of the method for manufacturing the organic electroluminescence device according to one embodiment of the present disclosure.

The present disclosure provides in some embodiments a method for manufacturing an organic electroluminescence device which, as shown in FIG. 3, includes the following steps.

Step 300: adjusting a grating period of a periodic grating structure in such a manner that a wavelength of an emergent light beam caused by SP-coupling is within a predetermined range of a light-emission peak of the organic electroluminescence device.

Depending on different light-exiting directions, the organic electroluminescence device may include a bottom-emission device and a top-emission device.

In this step, the grating period may be adjusted through a corresponding process. Taking the top-emission device as an example, a period of a grating pattern corresponding to a mask plate for a metallic reflective anode may be changed, so as to adjust the grating period. For example, in the case that the light-emission peak of the organic electroluminescence device is 800 nm, the corresponding grating period may be adjusted through equation (3), so that the wavelength of the emergent light beam caused by the SP-coupling is about 800 nm.

In this step, the predetermined range of the light-emission peak of the organic electroluminescence device may be a numeric range around the light-emission peak of the organic electroluminescence device, e.g., 500 nm~800 nm.

For example, Ag and $SiO_2$ are taken as the metal and the dielectric medium respectively. A relative dielectric constant of Ag is smaller than 10 at a low frequency. In a possible embodiment of the present disclosure, the relative dielectric constant of Ag is 8 and a relative dielectric constant of $SiO_2$ is 3.9. By substituting the two relative dielectric constants into equation (3), the corresponding grating period may be 494 nm in the case that the light-emission peak of the organic electroluminescence device is 800 nm.

Step 301: forming the periodic grating structure in the organic electroluminescence device in accordance with the obtained grating period by adjustment.

In a possible embodiment of the present disclosure, for the bottom-emission device, Step 301 may include: directly forming, e.g., through a template, the periodic grating structure with a metallic cathode in accordance with the grating period, so as to form a periodic metallic grating structure; or forming a cathode with a transparent conductive oxide, and forming the periodic metallic grating structure on a glass cover substrate above the transparent conductive oxide in a direction opposite to a light-emission direction in accordance with the grating period.

For the top-emission device, Step 301 may include: directly forming, e.g., through a template, the periodic grating structure with a metallic anode in accordance with the grating period, so as to form a periodic metallic grating structure; or forming an anode with a transparent conductive oxide, and arranging the periodic metallic grating structure below the transparent conductive oxide in a direction opposite to a light-emission direction in accordance with the grating period.

In a possible embodiment of the present disclosure, the periodic metallic grating structure may be separated from the transparent conductive oxide through a transparent insulation layer, e.g., a transparent insulation inorganic film. In this way, for the top-emission device, it is able to effectively increase hole injection capability through the anode made of the transparent conductive oxide. In addition, through the transparent insulation layer, it is able to facilitate the adjustment of the optical wave by adjusting a dielectric constant of the transparent insulation layer and prevent electrons in the metal from being diffused into the transparent electrode.

According to the method in the embodiments of the present disclosure, the periodic grating structure is arranged in the organic electroluminescence device, e.g., the OLED device, it is able to couple the optical wave with the SP, so as to regain, through the adjustment of SPP, the photon energy that has been lost at the interface of the metallic electrode and enhance an optical output of the organic electroluminescence device, e.g., the OLED device, thereby to improve the luminous efficiency of the organic electroluminescence device, e.g., the OLED device.

The method for manufacturing the organic electroluminescence device will be described hereinafter in more details in conjunction with the embodiments.

Figure 4:
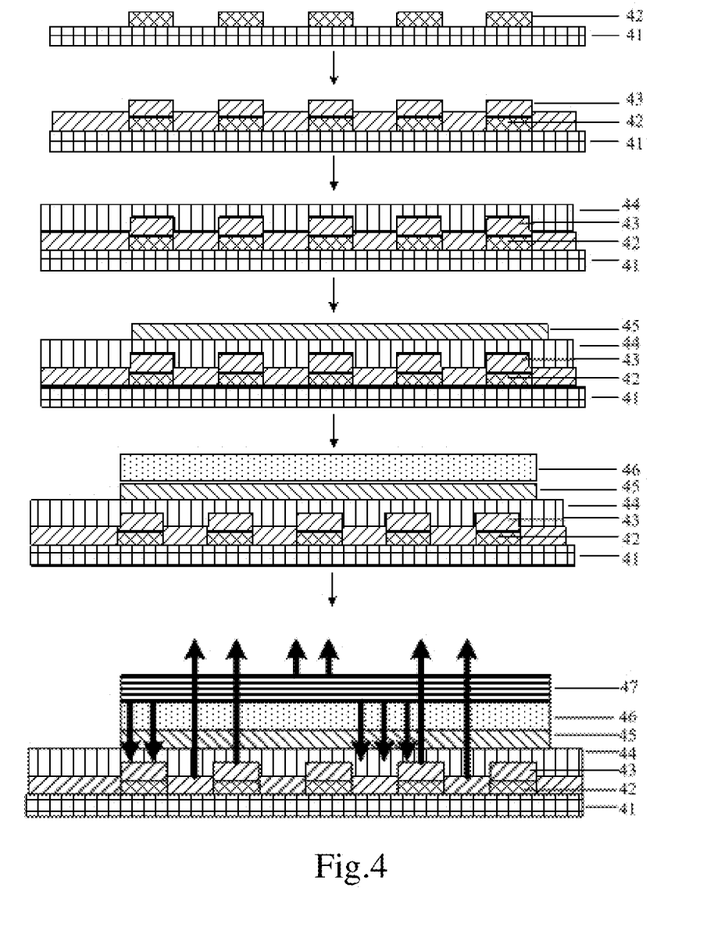
FIG. 4 is a schematic view showing the method for manufacturing the organic electroluminescence device according to the first embodiment of the present disclosure.

FIG. 4 is a schematic view showing the method for manufacturing the organic electroluminescence device according to the first embodiment of the present disclosure. In this embodiment, the top-emission device is taken as an example. As shown in FIG. 4, from top to bottom, the periodic grating structure 42 may be formed on a passivation layer (PVX) 41 of a TFT substrate at a corresponding EL region (a region indicated by bold and black arrows) through a dry-etching process or an exposing-and-developing process. Next, a metallic reflective layer 43 may be deposited onto the periodic grating structure 42 through sputtering, so as to reproduce the periodic grating structure under the metallic reflective layer at the EL region, thereby to acquire an SPP function. Next, an insulation layer 44 may be deposited onto the metallic reflective layer 43 through PCVD, and it may be separated from the metallic reflective layer 44 through a transparent insulation film. Next, an ITO anode 45 may be deposited onto the insulation layer 44 through sputtering, and an EL layer 46 may be deposited onto the anode 45 through evaporation. The anode 45 may be made of a transparent conductive oxide. Then, a transparent metallic cathode 47 may be deposited onto the EL layer 46 through thermal evaporation.

The metallic reflective layer 43 may be made of, but not limited to, Ag, Cu or Al. The transparent conductive oxide may include, but not limited to, indium tin oxide (ITO) or aluminium-doped zinc oxide (AZO).

For the top-emission device, the anode may be separated from the metallic reflective layer through a transparent insulation layer, e.g., a transparent insulation inorganic film. In this way, it is able to effectively increase a hole injection capability through the anode made of the transparent conductive oxide. In addition, through the transparent insulation inorganic film, it is able to facilitate the adjustment of the optical wave by adjusting a dielectric constant of the transparent insulation layer and prevent electrons in the metal from being diffused into the transparent electrode.

Figure 5:
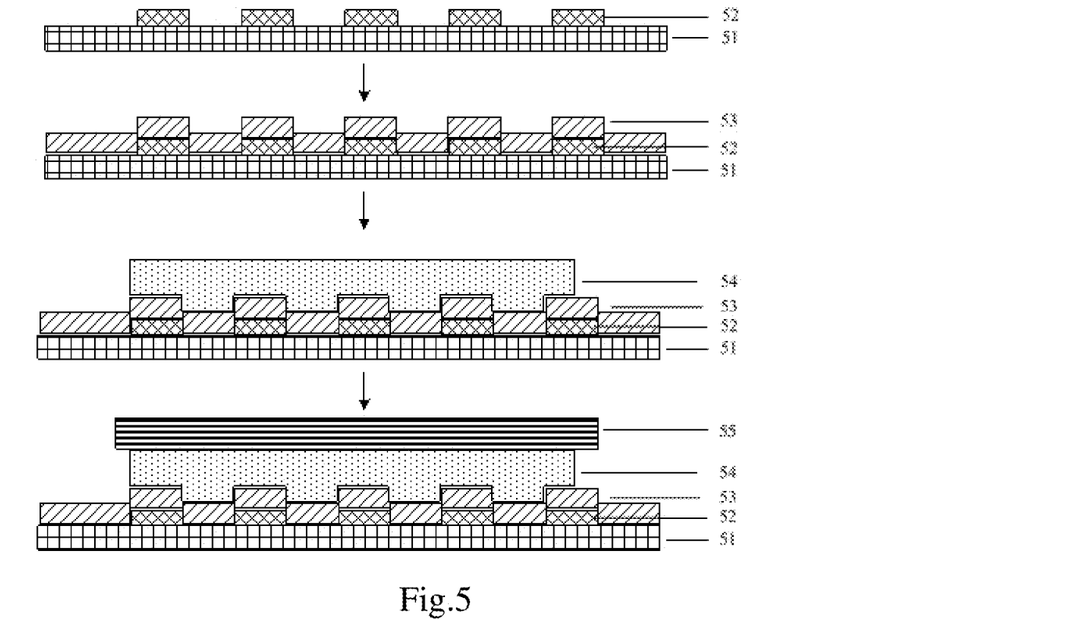
FIG. 5 is another schematic view showing the method for manufacturing the organic electroluminescence device according to the second embodiment of the present disclosure.

FIG. 5 is another schematic view showing the method for manufacturing the organic electroluminescence device according to the second embodiment of the present disclosure. In this embodiment, the top-emission device is still taken as an example. As shown in FIG. 5, the periodic grating structure 52 may be formed on a passivation layer PVX 51 of a TFT substrate at a corresponding EL region through a dry-etching process or an exposing-and-developing process. Next, a metallic reflective layer 53, as a reflective anode, may be deposited onto the periodic grating structure 52 through sputtering, so as to reproduce the periodic grating structure under the metallic reflective layer at the EL region, thereby to acquire an SPP function. Next, an EL layer 54 may be deposited onto the metallic reflective layer 53. Then, a transparent metallic cathode 55 may be deposited onto the EL layer 54.

The metallic reflective layer 53 may be made of, but not limited to, Ag, Cu or Al.

Figure 6:
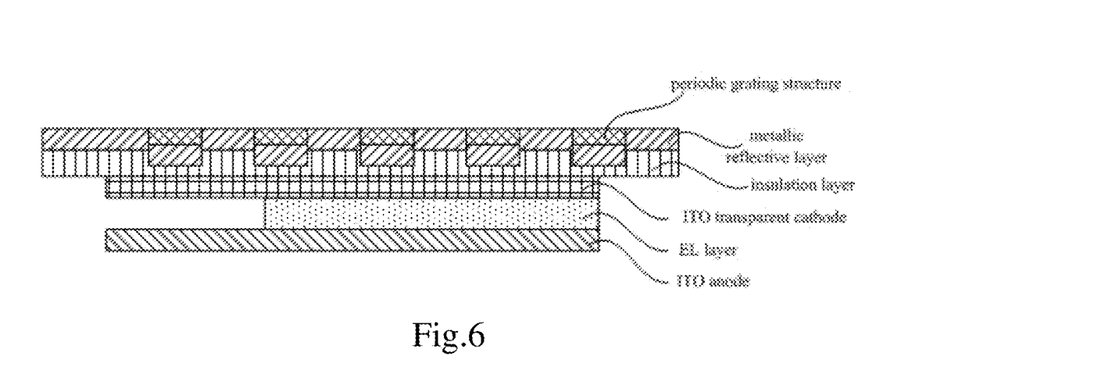
FIG. 6 is yet another schematic view showing the method for manufacturing the organic electroluminescence device according to the third embodiment of the present disclosure.

FIG. 6 is yet another schematic view showing the method for manufacturing the organic electroluminescence device according to the third embodiment of the present disclosure. In this embodiment, the bottom-emission device is taken as an example. A manufacturing procedure thereof is similar to that for the top-emission device in FIG. 4, and thus will not be particularly defined herein. As shown in FIG. 6, the transparent cathode may be made of ITO, the periodic metallic grating structure may be formed at the EL region of the glass cover substrate, and the transparent cathode may be separated from the periodic metallic grating structure through a transparent insulation inorganic film.

Figure 7:
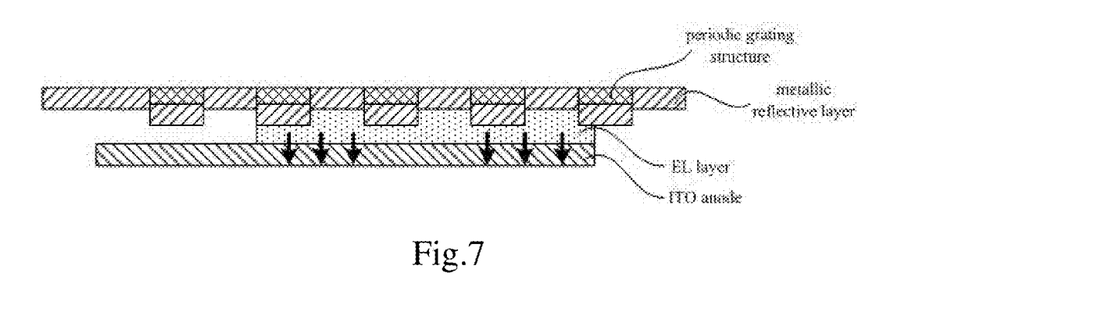
FIG. 7 is still yet another schematic view showing the method for manufacturing the organic electroluminescence device according to the fourth embodiment of the present disclosure.

FIG. 7 is still yet another schematic view showing the method for manufacturing the organic electroluminescence device according to the fourth embodiment of the present disclosure. In this embodiment, the bottom-emission device is still taken as an example. A manufacturing procedure thereof is similar to that for the top-emission device in FIG. 5, and thus will not be particularly defined herein. As shown in FIG. 7, the metallic cathode at the EL layer may be directly formed into the periodic grating structure.

It should be appreciated that, the periodic grating structure mentioned above is for illustrative purpose only, and it may be implemented in any other forms. For example, the periodic grating structure may be of a semicircular shape, as long as the requirement on the grating period is met. In addition, the periodic grating structure may be a convex structure as mentioned above, or a concave structure.

The present disclosure further provides in some embodiments an organic electroluminescence device, including: a metallic cathode in the form of a periodic metallic grating structure; or a cathode made of a transparent conductive oxide and the periodic metallic grating structure arranged on a glass cover substrate above the transparent conductive oxide in a direction opposite to a light-emission direction; or a metallic anode in the form of the periodic metallic grating structure; or an anode made of a transparent conductive oxide and the periodic metallic grating structure arranged below the transparent conductive oxide in a direction opposite to a light-emission direction.

In a possible embodiment of the present disclosure, the periodic metallic grating structure is separated from the transparent conductive oxide through a transparent insulation layer.

The present disclosure further provides in some embodiments a computer-readable storage medium storing therein computer-executable instructions which are executed so as to implement the above-mentioned method for manufacturing the organic electroluminescence device.

The present disclosure further provides in some embodiments a machine for manufacturing an organic electroluminescence device at least including a memory and a processor. The memory is configured to store therein executable instructions so as to: adjust a grating period of a periodic grating structure in such a manner that a wavelength of an emergent light beam caused by SP-coupling is within a predetermined range of a light-emission peak of the organic electroluminescence device; and form the periodic grating structure in the organic electroluminescence device in accordance with the obtained grating period by adjustment.

It should be appreciated that, such words as "in the middle", "on", "under", "front", "back", "vertical", "horizontal", "top", "bottom", "inside" and "outside" are merely used for simplifying the description, and they may merely each refer to a direction or a position relationship as shown in the drawings, but shall not be used to indicate or imply that the device or member must be arranged or operated at a specific position.

Unless otherwise defined, such words as "install", "connect" and "connected to" shall have the general meaning, e.g., they may each refer to: a fixed connection state, a removable connection state or an integral connection state; mechanical connection or electrical connection; or direct connection or indirect connection through an intermediate medium; or communication between two elements. The above-mentioned words may have the common meanings understood by a person of ordinary skills.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing an organic electroluminescence device, comprising steps of:
adjusting a grating period of a periodic grating structure in such a manner that a wavelength of an emergent light beam caused by surface plasmon (SP)-coupling is within a predetermined range of a light-emission peak of the organic electroluminescence device; and
forming the periodic grating structure in the organic electroluminescence device in accordance with the obtained grating period by adjustment;
wherein the step of forming the periodic grating structure in the organic electroluminescence device comprises, from top to bottom:
forming the periodic grating structure on a passivation layer PVX of a thin film transistor (TFT) substrate at a corresponding electroluminescence (EL) region through a dry-etching process or an exposing-and-developing process;
depositing a metallic reflective layer onto the periodic grating structure through sputtering, so as to reproduce the periodic grating structure under the metallic reflective layer at the EL region;
depositing an insulation layer onto the metallic reflective layer through plasma chemical vapor deposition (PCVD);
depositing a transparent conductive oxide onto the insulation layer through sputtering so as to form an anode, and depositing an EL layer onto the transparent conductive oxide through evaporation; and
forming a transparent metallic cathode onto the EL layer through thermal evaporation.

2. The method according to claim 1, wherein the organic electroluminescence device is a bottom-emission device, and the step of forming the periodic grating structure in the organic electroluminescence device comprises:
forming the periodic grating structure with a metallic cathode in accordance with the grating period, so as to form a periodic metallic grating structure; or
forming a cathode with a transparent conductive oxide, and forming the periodic metallic grating structure on a glass cover substrate above the transparent conductive oxide in a direction opposite to a light-emission direction in accordance with the grating period.

3. The method according to claim 2, wherein the periodic metallic grating structure is separated from the transparent conductive oxide through a transparent insulation layer.

4. The method according to claim 2, wherein the grating period is in direct proportion to the wavelength of the emergent light beam from the organic electroluminescence device.

5. The method according to claim 1, wherein the organic electroluminescence device is a top-emission device, and the step of forming the period grating structure in the organic electroluminescence device comprises:
forming the periodic grating structure with a metallic anode in accordance with the grating period, so as to form a periodic metallic grating structure; or
forming an anode with a transparent conductive oxide, and arranging the periodic metallic grating structure below the transparent conductive oxide in a direction opposite to a light-emission direction in accordance with the grating period.

6. The method according to claim 5, wherein the periodic metallic grating structure is separated from the transparent conductive oxide through a transparent insulation layer.

7. The method according to claim 5, wherein the grating period is in direct proportion to the wavelength of the emergent light beam from the organic electroluminescence device.

8. The method according to claim 1, wherein the grating period is in direct proportion to the wavelength of the emergent light beam from the organic electroluminescence device.

9. The method according to claim 1, wherein the predetermined range of the light-emission peak of the organic electroluminescence device is 500 nm~800 nm.

10. The method according to claim 1, wherein the grating period is adjusted using the following equation:

$$k_{light}(\lambda) = \frac{2\pi}{\lambda}\sin\theta = k_{sp}(\lambda) \pm \frac{2\pi}{\Lambda}m,$$

where $K_{light}$ represents a wave vector of the emergent light beam; $\lambda$ represents a wavelength of the emergent light beam; $\theta$ represents a measurement angle, $\Lambda$ represents the grating period, m represents a magnitude, Ksp represents a wave vector of the SP and is calculated using the following equation:

$$k_{sp}(\lambda) = \frac{2\pi}{\lambda}\sqrt{\frac{\varepsilon_1\varepsilon_2}{\varepsilon_1 + \varepsilon_2}},$$

where ε1 and ε2 represent dielectric constants of a metal and a medium respectively.

\* \* \* \* \*

UNITED STATES PATENT AND TRADEMARK OFFICE
CERTIFICATE OF CORRECTION

PATENT NO. : 10,581,029 B2  
APPLICATION NO. : 15/802431  
DATED : March 3, 2020  
INVENTOR(S) : Jun Wang et al.

It is certified that error appears in the above-identified patent and that said Letters Patent is hereby corrected as shown below:

On the Title Page

Item (73) Assignee:  
Delete "(Hefei, Ahnui, CN)"  
Insert --"(Hefei, Anhui, CN)--

Signed and Sealed this  
First Day of August, 2023

Katherine Kelly Vidal  
*Director of the United States Patent and Trademark Office*